(12) United States Patent
Lin

(10) Patent No.: US 6,700,188 B2
(45) Date of Patent: Mar. 2, 2004

(54) LOW-PIN-COUNT CHIP PACKAGE HAVING CONCAVE DIE PAD AND/OR CONNECTIONS PADS

(75) Inventor: Chun Hung Lin, Kaohsiung (TW)

(73) Assignee: Advanced Semiconductor Engineering, Inc., Kaoshiung (TW)

(*) Notice: Subject to any disclaimer, the term of this patent is extended or adjusted under 35 U.S.C. 154(b) by 216 days.

(21) Appl. No.: 09/854,487

(22) Filed: May 15, 2001

(65) Prior Publication Data

US 2001/0019854 A1 Sep. 6, 2001

Related U.S. Application Data

(62) Division of application No. 09/516,024, filed on Feb. 29, 2000, now Pat. No. 6,238,952.

(51) Int. Cl.[7] .......................... H01L 23/48; H01L 29/40
(52) U.S. Cl. .................... 257/684; 257/666; 257/698; 257/692; 257/676; 257/712; 257/713; 257/796; 257/786; 257/784
(58) Field of Search ................... 257/684, 666, 257/698, 676, 712, 713, 796, 784, 786, 692, 693, 696

(56) References Cited

U.S. PATENT DOCUMENTS

| | | | |
|---|---|---|---|
| 5,838,062 A | * | 11/1998 | Hwang et al. |
| 5,900,676 A | | 5/1999 | Kweon et al. |
| 6,001,671 A | | 12/1999 | Fjelstad |
| 6,081,029 A | * | 6/2000 | Yamaguchi ............. 257/718 |
| 6,163,069 A | * | 12/2000 | Oohira et al. ............ 257/684 |
| 6,191,494 B1 | * | 2/2001 | Ooyama et al. .......... 257/796 |
| 6,255,740 B1 | * | 7/2001 | Tsuji et al. .............. 257/792 |
| 6,294,830 B1 | * | 9/2001 | Fjelstad ................. 257/724 |
| 6,306,685 B1 | * | 10/2001 | Liu et al. ................ 438/121 |
| 6,338,984 B2 | * | 1/2002 | Minamio et al. ......... 438/123 |
| 6,342,730 B1 | * | 1/2002 | Jung et al. |
| 6,455,348 B1 | * | 9/2002 | Yamaguchi ............. 257/666 |

FOREIGN PATENT DOCUMENTS

CN     348306     11/1985

* cited by examiner

Primary Examiner—Alexander Oscar Williams
(74) Attorney, Agent, or Firm—Lowe Hauptman Gilman & Berner LLP

(57) ABSTRACT

A low-pin-count chip package including a die pad for receiving a semiconductor chip and a plurality of connection pads electrically coupled to the semiconductor chip wherein the die pad and the connection pads have a concave profile. A package body is formed over the semiconductor chip, the die pad and the connection pads in a manner that a potion of the die pad and a portion of each connection pad extend outward from the bottom of the package body. The present invention further provides a novel method of producing the low-pin-count chip package described above.

7 Claims, 6 Drawing Sheets

LOW-PIN-COUNT CHIP PACKAGE HAVING CONCAVE DIE PAD AND/OR CONNECTIONS PADS

This is a Division of Ser. No. 09/516,029 filed Feb. 29, 2000, now U.S. Pat. No. 6,238,952.

BACKGROUND OF THE INVENTION

1. Field of the Invention

This invention relates to semiconductor chip packages, and more specifically to low-pin-count chip packages and manufacturing methods thereof.

2. Description of the Related Art

FIG. 1 is a low-pin-count chip package 100 according to a preferred embodiment disclosed in R. O. C. Publication No. 348306 entitled "Device Having Resin Package And Method Of Producing The Same". The low-pin-count chip package 100 includes a chip 110 sealed in a package body 120. The active surface of the chip 110 is provided with a plurality of bonding pads 110a electrically connected to a plurality of connection pads 130. The backside surface of the chip 110 is exposed from the package body 120 through a conductive adhesive layer 112. The connection pads 130 are located at the periphery of the chip 110 and exposed from the lower surface of the package body 120 for making external electrical connection.

R. O. C. Publication No. 348306 also discloses a method for making the low-pin-count chip package 100. The method mainly utilizes a metal frame 140 (see FIG. 2) to fabricate a plurality of the low-pin-count chip packages 100 simultaneously. The method comprises the steps of: (A) applying a photoresist layer over one surface of the metal frame 140, pattern transferring, and developing in a manner that areas on the metal frame 140 at which it is desired to form the connection pads 130 are not covered by the photoresist layer; (B) plating a layer of metal such as gold or palladium on the areas on the metal frame 140 without protection of the photoresist layer; (C) stripping the remaining photoresist; (D) attaching the backside surface of the semiconductor chip 110 onto the metal frame 140 through an adhesive layer; (E) electrically coupling the bonding pads 110a on the semiconductor chip 110 to the corresponding connection pads 130; (F) forming a package body over the semiconductor chip 110. Finally, a separation step is performed to remove the metal frame 140. As shown in FIG. 2, the separation step typically comprises selectively etching the metal frame 140 with the connection pads 130 remaining intact by an etching agent.

Since the package body 120 does not cover the exposed lower surface of the connection pads 130, it can not firmly lock the connection pads 130. Adhesion depends on the overall nature of the interface region. A method for promoting adhesion is increasing the area of the interface between the package body 120 and the connection pads 130. However, since the connection pads 130 are formed by plating, the thickness thereof is practically limited to the time for plating. Typically, thickness of the metal plating is only about 0.4 to 0.8 mil, which contributes quite little to the adhesion between the package body 120 and the connection pads 130.

The connection pads 130 are usually made of metal with good electrical conductivity such as copper but the package body 120 is made of insulating material such as epoxy molding compound. Accordingly, the bond between connection pads 130 and the package body 120 is relatively weak and the difference of the coefficient of thermal expansion (CTE) therebetween is very large. Because of the CTE mismatch, stresses are induced at the interface between the connection pads and the plastic package body as the conventional package experiences temperature cycling. The stresses, in turn, result in the delamination at the metal-plastic interface. When the delaminations had occurred at the plastic-metal interface, moistures from the environment are easy to penetrate into the plastic package body and accumulate in the delaminated area. Once moisture accumulates in the package, rapid temperature ramp-up will cause the moisture to vaporize and expand, thereby inducing an hygrothermal stresses in the delaminated area which causes the surrounding plastic package body to popcorn. One of the most common occurrence of package popcorning occurs when the package described above is surface-mounted to a printed wiring board during the Infra-Red reflowing process.

Therefore, there is a need for increasing the thickness of connection pads 130 so as to increase the area of the interface between the package body and the connection pads thereby promoting adhesion therebetween, thereby overcoming, or at least reducing the above-mentioned problems of the prior art.

Further, the conventional package 100 is mounted to a substrate, such as a circuit board, like other leadless devices. For example, a PC board is screened printed with a solder paste in a pattern that corresponds to the pattern of the connection pads 130 exposed from the bottom surface of the package 100. The package 100 is then appropriately positioned on the PC board and the solder is reflowed. It should be understood that the exposed portions of the connection pads 130 of the package 100 can be printed with solder paste and then mounted to a substrate. However, either way requires extreme care in aligning the solder paste with the connection pads 130 exposed from the bottom surface of the package 100.

U.S. Pat. No. 5,900,676 discloses a low-pin-count chip package 150 (see FIG. 3) having a plurality of column leads 162. The package 150 comprises a semiconductor chip 172 disposed on a die pad 160 and electrically connected to the column leads 162. A package body 180 is formed over the semiconductor chip 172 and the column leads 162. The package 150 is characterized in that the die pad 160 and the column leads 162 extend outward from the package body 180. The projecting portions of the column leads 162 from the bottom of the package 150 facilitate surface mounting of the package 150 to a substrate.

U.S. Pat. No. 5,900,676 also discloses a method for making the low-pin-count chip package 150 comprising the steps of: (a) providing a copper foil having a polyimide layer 152 formed on the bottom surface thereof; (b) etching the copper foil so as to form a die pad 160 and a plurality of column leads 162 (see FIG. 4); (c) forming a metal layer 166 (such as gold or palladium) on the upper surface of the die pad 160 and column leads 162 as well as exposed areas on the surface of the polyimide layer 152 (see FIG. 5); (d) attaching a semiconductor chip 172 onto the metal layer on the die pad through an adhesive layer 170; (e) electrically coupling the bonding pads 172a on the semiconductor chip 172 to the corresponding column leads 162; (f) forming a package body 180 over the semiconductor chip 172, column leads 162 and the polyimide layer 152 (see FIG. 6); (g) removing the polyimide layer 152 and the metal layer 166 thereon simultaneously thereby obtaining the package 150.

U.S. Pat. No. 5,900,676 teaches that the metal layer 166 is formed by plating. Therefore, in step (c), the metal layer 166 should also appear on the side surfaces of the die pad 160 and the column leads 162 such that the die pad 160 and the column leads 162 will be removed from the package body 180 together with the polyimide layer 152 and the metal layer 166 during step (g). Accordingly, the side surfaces of the die pad 160 and the column leads 162 should be masked whereby the metal layer 166 will not form on the side surfaces thereof. However, this will introduce additional steps into the process for the package 150 thereby prolonging cycle time, and thereby increasing cost. Further, U.S. Pat. No. 5,900,676 also teaches that the thickness of the metal layer 166 is preferably half the thickness of the die pad 160 or the column leads 162. However, below a certain thickness, the die pad 160 and column leads 162 cannot be relied upon for providing adequate adhesion to the package body 180. Therefore, the time for plating the metal layer 166 will become so long that the cycle time is significantly increased. Thus, this previously described method for making the low-pin-count chip package 150 is quite not practical. Besides, in U.S. Pat. No. 5,900,676, the metal layer is preferable formed of noble metals such as gold or palladium, which means a high cost for the metal layer that is half as thick as the column leads.

SUMMARY OF THE INVENTION

The present invention therefore seeks to provide a low-pin-count chip package which overcomes, or at least reduces the above-mentioned problems of the prior art.

Accordingly, in a first aspect, the present invention provides a low-pin-count chip package including a die pad for receiving a semiconductor chip and a plurality of connection pads electrically coupled to the semiconductor chip wherein the die pad and the connection pads have a concave profile. A package body is formed over the semiconductor chip, the die pad and the connection pads in a manner that a potion of the die pad and a portion of each connection pad extend outward from the bottom of the package body.

In the chip package of the present invention, the die pad and the connection pads have a concave profile thereby enhancing the "locking" of the die pad and the connection pads in the package body as well as prolonging the path and time for moisture diffusion into the package. Further, a portion of the die pad and a portion of each connection pad extend outward from the bottom of the package body so as to enhance stand-off and solderability thereof.

According to a second aspect, this invention further provides a method of producing a low-pin-count chip package. The method comprises the steps of: (a) providing a metal carrier plate having opposing upper and lower surfaces, the upper surface of the metal carrier plate having a central bulge for receiving a semiconductor chip and a plurality of peripheral bulge arranged at the periphery of the central bulge, the upper surfaces of the central bulge and the peripheral bulges having a first metal coating formed thereon, the lower surface of the metal carrier plate having a second metal coating formed corresponding to the first metal coating; (b) attaching a semiconductor chip onto the central bulge of the metal carrier plate; (c) electrically coupling the semiconductor chip to the peripheral bulges of the metal carrier plate; (d) forming a package body over the semiconductor chip and the metal carrier plate; and (e) etching areas on the lower surface of the metal carrier plate without protection of the second metal coating such that the central bulge and each of the peripheral bulges are separated from one another so as to form a die pad and a plurality of connection pads. Preferably, the metal carrier plate provided in step (a) is formed from the steps of: providing a copper foil having opposing upper and lower surfaces; applying a first photoresist layer on the upper surface of the copper foil and a second photoresist layer on the lower surface of the copper foil; photoimaging and developing the photoresist layers so as to expose predetermined portions of the copper foil; forming the first metal coating on the exposed portions of the upper surface of the copper foil and the second metal coating on the exposed portions of the lower surface of the copper foil; stripping the first photoresist layer; half-etching areas on the upper surface of the copper foil exposed from the first metal coating so as to form the central bulge and the peripheral bulges; and stripping the second photoresist layer.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 12:
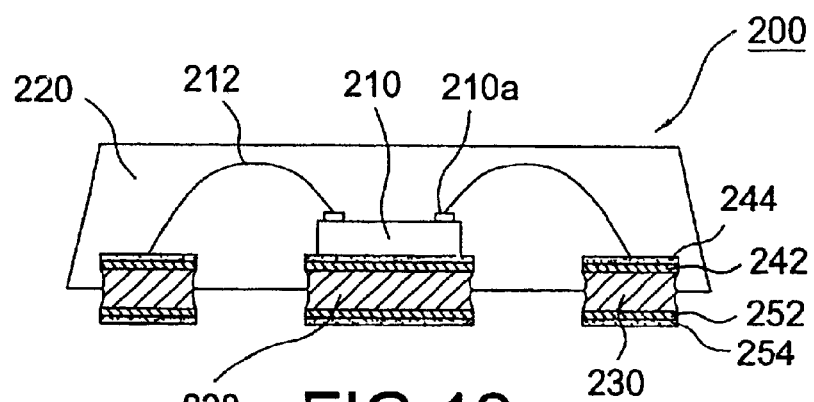
FIG. 12 is a cross-sectional view of a low-pin-count chip package according to a first embodiment of the present invention.

FIG. 12 discloses a low-pin-count chip package 200 in accordance with a first embodiment of the present invention comprising a chip 210 attached to a die pad 232 by either a conductive adhesive layer or nonconductive adhesive layer, e.g., epoxy (not shown). The active surface of the chip 210 is provided with a plurality of bonding pads 210a electrically connected to connection pads 230 through bonding wires 212. The connection pads 230 are arranged at the periphery of the die pad 232. A package body 220 is formed over the semiconductor chip 210, the die pad 232 and the connection pads 230 in a manner that a potion of the die pad 232 and a portion of each connection pad 230 extend outward from the bottom of the package body 220.

Figure 16:
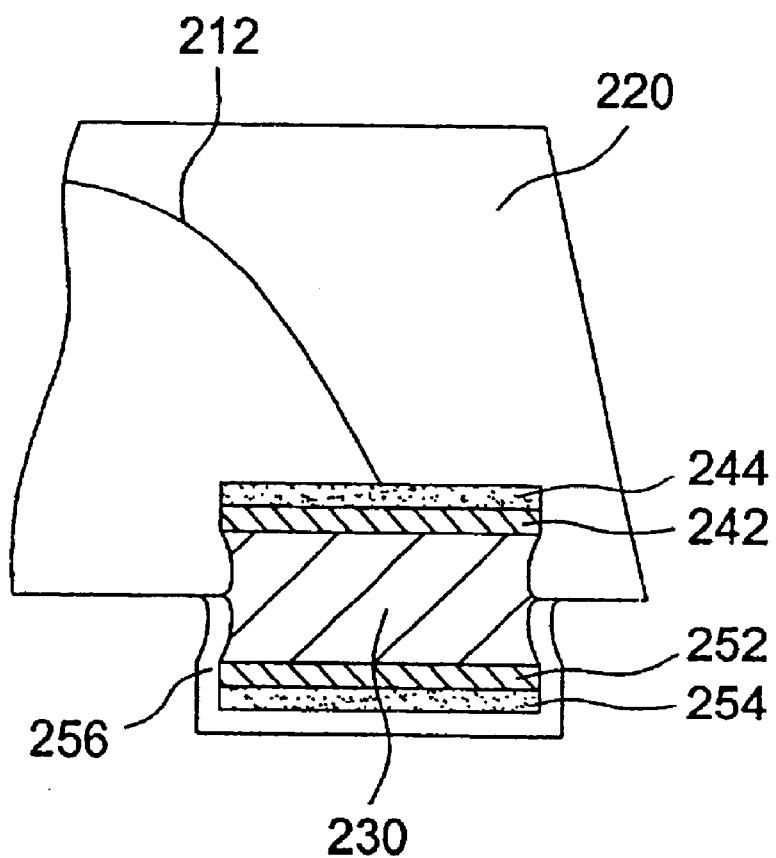
FIG. 16 illustrates, in an enlarged cross-sectional view, a connection pad of a low-pin-count chip package according to the present invention.

Referring to FIG. 12 and FIG. 16, the connection pads 230 and the die pad 232 have a concave profile thereby enhancing the "locking" of the die pad 232 and the connection pads 230 in the package body 220 as well as prolonging the path and time for moisture diffusion into the package 200. Therefore, adhesion between the package body 220 and the die pad 232 as well as the connection pads 230 is significantly increased thereby enhancing the "locking" of the die pad 230 and the connection pads 232 into predetermined positions in the package body 220. Further, the projecting portions of the die pad 230 and the connection pads 232 from the bottom of the package body enhance solderability thereof.

Preferably, the die pad 232 and the connection pads 230 are provided with a first metal coating which allows a good bond to be formed with the bonding wires 212. The first metal coating typically comprises a layer of nickel 242 covering the upper surfaces of the die pad 232 and the connection pads 230, and a layer of gold (or palladium) 244 covering the nickel layer 242. The lower surfaces of the die pad 232 and the connection pads 230 have a second metal coating formed thereon. The second metal coating preferably comprises a layer of nickel 252 covering the lower surfaces of the die pad 232 and the connection pads 230, and a layer of gold (or palladium) 254 covering the nickel layer 252. The second metal coating prevents the lower surfaces of the die pad 232 and the connection pads 230 from corrosion or contamination thereby assuring the solder-joint reliability. Besides, the projecting portions of the die pad 230 and the connection pads 232 are preferably provided with a third metal coating 256 formed thereon (see FIG. 16) thereby protecting the side surfaces thereof from corrosion or contamination. The third metal coating 256 may be a layer of gold or nickel.

The package 200 can be mounted onto a substrate, such as a printed circuit board (PC board), like other leadless devices. For example, a PC board is screen printed with a solder paste in a pattern which corresponds to the pattern of the connection pads 230 exposed from the bottom surface of the package 200. The package 200 is then appropriately positioned on the PC board and the solder is reflowed by using the conventional surface mount technology. Alternatively, the connection pads 230 exposed from the bottom surface of the package 200 can be printed with solder paste and then mounted onto a substrate. According to the present invention, the projecting portions of the die pad 232 and the connection pads 230 facilitate surface mounting of the package 200 to a substrate.

FIGS. 7–11 show a method of making the low-pin-count chip package 200 according to a first embodiment of the present invention.

Figure 1:
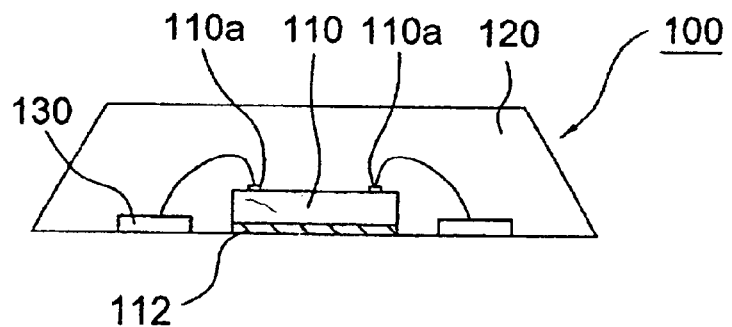
FIG. 1 is a cross-sectional view of a low-pin-count chip package according to a preferred embodiment disclosed in R. O. C. Publication No. 348306 entitled "Device Having Resin Package And Method Of Producing The Same"
Figure 2:
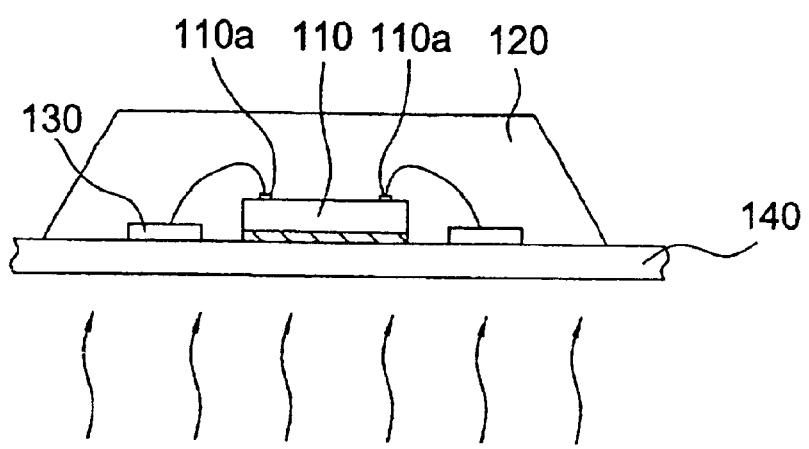
FIG. 2 illustrates the separation step of a method for making the low-pin-count chip package of FIG. 1.
Figure 3:
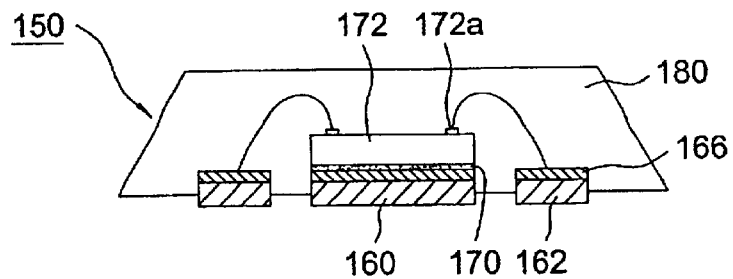
FIG. 3 is a cross-sectional view of a low-pin-count chip package according to a preferred embodiment disclosed in U.S. Pat. No. 5,900,676.
Figure 4:
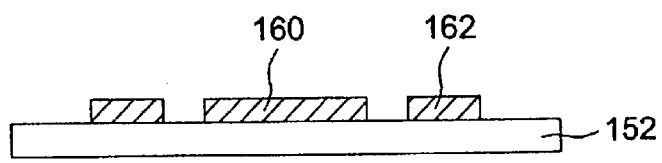
FIGS. 4–6 illustrate a method for making the low-pin-count chip package of FIG. 3.
Figure 5:
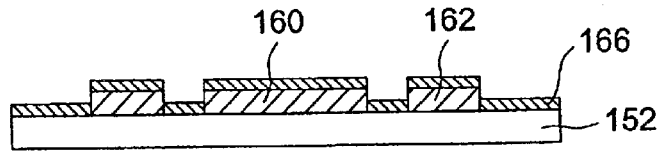
Figure 6:
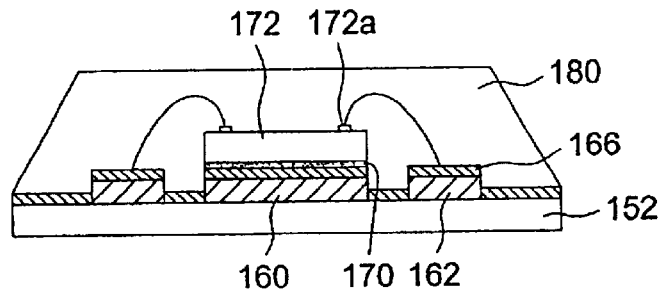
Figure 7:
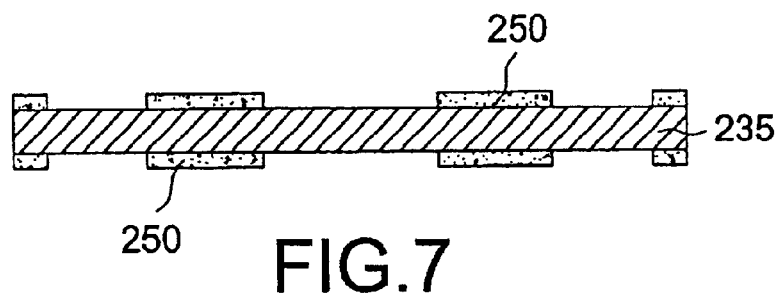
FIGS. 7–11 illustrate a method of making a low-pin-count chip package according to a first embodiment of the present invention

Referring to FIG. 7, a photoresist layer 350 is formed on a copper foil 235 by conventional techniques such as printing. Then, the photoresist layer 250 is photochemically defined through a photomask (not shown) and developed to expose predetermined portions of the copper foil 235. The photoresist layer 250 is mainly composed of a resin mixture and a photoactive material that makes the photoresist layer 280 photodefinable. Preferably, the copper foil 235 has a thickness of about 4–20 mils.

Figure 8:
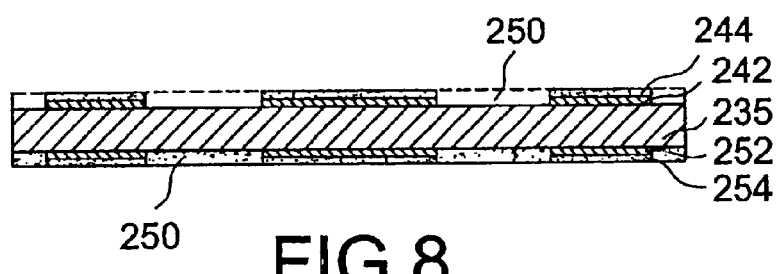

Referring to FIG. 8, a first metal coating including a layer of nickel 242, and a layer of gold (or palladium) 244 is formed on the exposed portions of the upper surface of the copper foil 235 by using conventional plating techniques. In the meanwhile, a second metal coating including a layer of nickel 252, and a layer of gold (or palladium) 254 is formed on the exposed portions of the lower surface of the copper foil 235 by plating. After that, the remaining photoresist on the upper surface of the copper foil 235 (as illustrated by the dotted lines in FIG. 8) is stripped.

Figure 9:
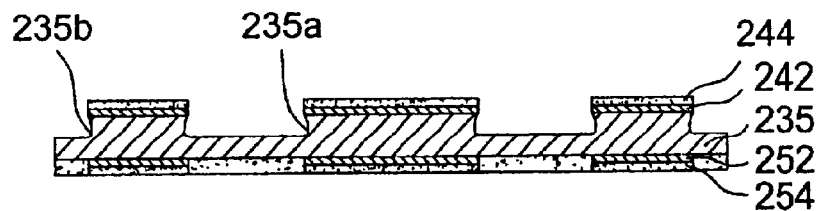

Referring to FIG. 9, areas on the upper surface of the copper foil 235 without protection of the first metal coating are half-etched to form a central bulge 235a and a plurality of peripheral bulge 235b. The central bulge 235a and the peripheral bulge 235b not etched in the half-etching process will form the die pad 232 and the connection pads 230 afterward (see FIG. 12). In this embodiment, the thickness of the copper foil 235 is approximately 4~20 mil, and the etching depth is about 2–8 mils which depends on the thickness of the copper foil 235. It is noted that the "half-etching" herein does not mean only exactly removing an half of the thickness of the copper foil 235 through etching but also includes a partial etching for removing merely a part of the thickness of the copper foil 270. Finally, the remaining photoresist layer 270 on the lower surface of the copper foil 235 is stripped by conventional methods so as to obtain a metal carrier plate 240 as shown in FIG. 10.

Figure 10:
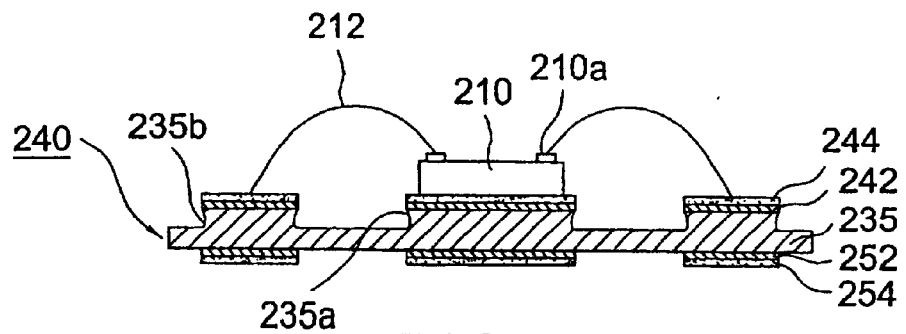

Referring to FIG. 10, the semiconductor chip 210 is securely attached onto the central bulge 235a of the metal carrier plate 240 through an adhesive layer such as conductive/nonconductive epoxy (not shown). The upper surface of the metal carrier plate 240 has a plurality of peripheral bulges 235b formed at the periphery of the central bulge 235a. A plurality of bonding wires 212 are connected to the bonding pads 210a on the chip 210 and the peripheral bulges 235b using known wire bonding techniques.

Figure 11:
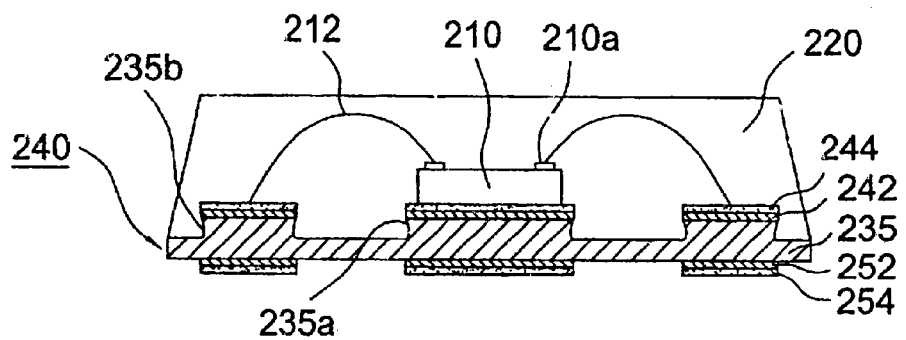

Referring to FIG. 11, the package body 220 is formed over the metal carrier plate 240, the peripheral bulges 235b and the semiconductor chip 210 using known plastic molding methods such as transfer molding.

Finally, areas on the lower surface of the metal carrier plate 240 without protection of the second metal coating are etched such that the central bulge 235a and each of the peripheral bulges 235b are separated from one another so as to form the die pad 232 and the connection pads 230, thereby obtaining the low-pin-count chip package 200 as shown in FIG. 12. Therefore, in this embodiment, the embedded portions of the die pad 232 and the connection pads 230 have a thickness about half the thickness of the copper foil 235.

Through precisely adjusting parameters of the etching process, e.g., the concentration of etchant or the time period of the etching process, the die pad 232 and the connection pads 230 have a substantially concave profile when etching process is completed. During the curing process, the molding compound shrinks and imposes tension stress on the central bulge 235a and the peripheral bulges 235b (see FIG. 11). Therefore, the die pad 232 and the connection pads 230 are locked in position by the hardened molding compound.

Figure 15:
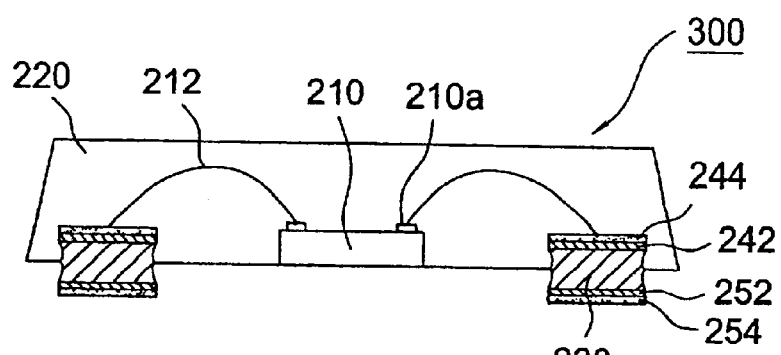
FIG. 15 is a cross-sectional view of a low-pin-count chip package according to a second embodiment of the present invention.

FIG. 15 discloses a low-pin-count chip package 300 in accordance with a second embodiment of the present invention comprising a chip 210 sealed in a package body 220. The package 300 is substantially identical to the package 200 of FIG. 12 with exception that the die pad 232 is skipped and the conductive (or nonconductive) adhesive layer (not shown) is directly exposed from the package body 220.

Figure 13:
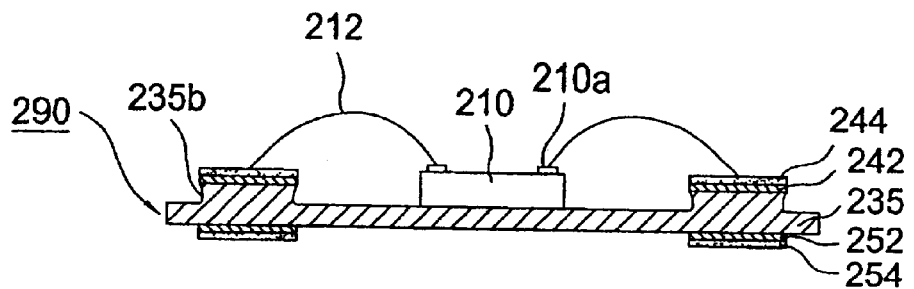
FIGS. 13–14 illustrate a method of making a low-pin-count chip package according to a second embodiment of the present invention.
Figure 14:
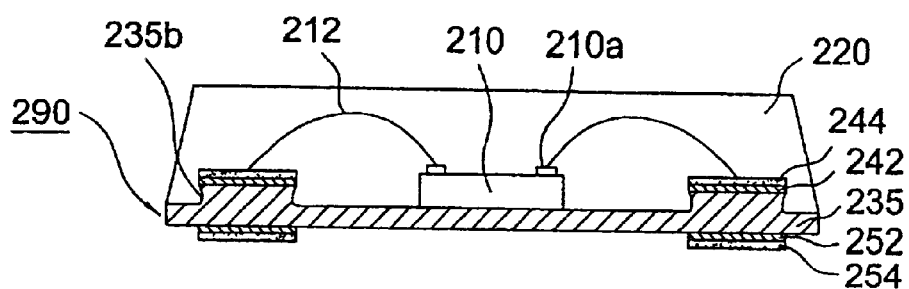

FIGS. 13–14 illustrate a method of making the low-pin-count chip package 300 according to a second embodiment of the present invention.

Referring to FIG. 13, the semiconductor chip 210 is securely attached onto a metal carrier plate 290 through an adhesive layer such as conductive/nonconductive epoxy (not shown). The upper surface of the metal carrier plate 290 has a plurality of peripheral bulges 235b formed at the periphery of the semiconductor chip 210. A plurality of bonding wires 212 are connected to the bonding pads 210a on the chip 210 and the peripheral bulges 235b using known wire bonding techniques.

In this alternative embodiment, the metal carrier plate 290 is substantially formed with steps analogous to the steps presented in connection with FIGS. 7–9 with exception that the central bulge 235a and the first metal coating formed thereon are skipped from the metal carrier plate 290.

Referring to FIG. 14, a package body 220 is formed over the metal carrier plate 290, the peripheral bulges 235b and the semiconductor chip 210 using known plastic molding methods such as transfer molding.

Finally, areas on the lower surface of the metal carrier plate 240 without protection of the second metal coating are etched such that each of the peripheral bulges 235b is separated from one another so as to form the connection pads 230, thereby obtaining the low-pin-count chip package 300 as shown in FIG. 15.

Referring to FIG. 16, in the preferred embodiments of the present invention, the projecting portions of the die pad 230 and the connection pads 232 from the bottom of the package body 220 are preferably provided with a third metal coating 256 formed thereon thereby protecting the side surfaces thereof from corrosion or contamination. The third metal coating 256 is preferably formed by electroless gold deposition or electroless nickel deposition.

According to the present invention, the die pad 232 as well as the connection pads 230 have a concave profile thereby enhancing the "locking" of the die pad and the connection pads in the package body as well as prolonging the path and time for moisture diffusion into the package. Further, a portion of the die pad and a portion of each connection pad extend outward from the bottom of the package body to enhance solderability thereof. When the package of the present invention is mounted to a printed circuit board, the bottom of the package and the printed circuit board are spaced apart due to the protrusion portions of the die pad and the connection pads having a prescribed height. Therefore, the bonding of the connection pads to the printed circuit board can be easily checked through the space formed between the bottom of the package and the printed circuit board. Moreover, a smooth air flow therethrough serves to facilitate emitting of the heat occurring from the package to the exterior.

Although the invention has been explained in relation to its preferred embodiment, it is to be understood that many other possible modifications and variations can be made without departing from the spirit and scope of the invention as hereinafter claimed.

What is claimed is:

1. A low-pin-count chip package comprising:
   a die pad and a plurality of connection pads arranged around the die pad wherein the die pad and the connection pads have a concave profile;
   a first metal coating on the upper surface of the die pad and the connection pads;
   a semiconductor chip disposed on the die pad and electrically coupled to the connection pads;
   a package body formed over the semiconductor chip and the connection pads in a manner that a portion of the die pad and a portion of each connection pad extend outward from the bottom of the package body; and
   a second metal coating on the lower surface of the die pad and the connection pads,
   wherein each of the die pad and the connection pads has a first portion embedded in the package body and a second portion located outside the package body, both the first and second portions have concave profiles.

2. The low-pin-count chip package as claimed in claim 1, wherein each of the first and the second metal coating comprises a layer of nickel covering the surface of the die pad and the connection pads, and a layer of metal selected from the group consisted of gold and palladium covering the nickel layer.

3. The low-pin-count chip package as claimed in claim 1, wherein the extension portions of the die pad and each connection pad have a height of at least 2 mils.

4. The low-pin-count chip package as claimed in claim 1, wherein areas on the surfaces of the die pad and each connection pad without protection of the package body have a third metal coating formed thereon thereby avoiding corrosion and contamination.

5. The chip package of claim 1, wherein each of the die pad and connection pads is a piece made of a single material which projects integrally from within the package body outwardly and beyond a bottom surface of the package body.

6. The chip package of claim 5, wherein said single material is copper.

7. The chip package of claim 5, wherein said piece has a first portion embedded in the package body and a second portion located outside the package body, said second portion having a lower surface covered by the second metal coating and side surfaces uncovered by the second metal coating, said chip package further comprising a third metal coating covering the side surfaces of the second portion and the second metal coating.

* * * * *